(12) United States Patent
Harriman

(10) Patent No.: US 7,126,388 B2
(45) Date of Patent: Oct. 24, 2006

(54) POWER MOSFET DRIVER AND METHOD THEREFOR

(75) Inventor: Paul J. Harriman, Goodyear, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 48 days.

(21) Appl. No.: 11/013,074

(22) Filed: Dec. 16, 2004

(65) Prior Publication Data

US 2006/0132194 A1    Jun. 22, 2006

(51) Int. Cl.
*H03K 3/00* (2006.01)
(52) U.S. Cl. .................... 327/108; 327/390
(58) Field of Classification Search ........ 327/108–112, 327/390, 423, 424, 434, 491; 326/82, 83, 326/88
See application file for complete search history.

(56) References Cited

U.S. PATENT DOCUMENTS

| | | | | |
|---|---|---|---|---|
| 4,467,224 A | * | 8/1984 | Maddox | ............... 327/111 |
| 5,408,150 A | * | 4/1995 | Wilcox | ............... 327/108 |
| 5,552,731 A | * | 9/1996 | Diazzi et al. | ............... 327/109 |
| 6,982,574 B1 | * | 1/2006 | Harriman et al. | ............... 327/108 |
| 2002/0105311 A1 | * | 8/2002 | Rutter et al. | ............... 323/283 |
| 2003/0173994 A1 | * | 9/2003 | Lai et al. | ............... 326/81 |
| 2003/0218186 A1 | * | 11/2003 | Hano | ............... 257/197 |
| 2005/0212587 A1 | * | 9/2005 | Meek et al. | ............... 327/536 |

OTHER PUBLICATIONS

"NCP5318 Two/Three/Four-Phase Buck CPU Controller", Semiconductor Components Industries, L.L.C., Oct. 2004 Rev. 1, pp. 1-32.
"NCP5355 12 V Synchronous Buck Power MOSFET Driver", Semiconductor Components Industries, L.L.C., Jun. 2004-Rev. 6, pp. 1-12.
"NCP3418, NCP3418A Dual Bootstrapped 12 V MOSFET Driver With Output Disable", Semiconductor Components Industries, L.L.C., May 2004-Rev. 10, pp. 1-10.

* cited by examiner

*Primary Examiner*—Linh My Nguyen
*Assistant Examiner*—Thomas J. Hiltunen
(74) *Attorney, Agent, or Firm*—Robert F. Hightower

(57) ABSTRACT

In one embodiment, a power MOSFET driver uses two different voltages for the operating voltage of the two output drivers of the power MOSFET driver.

19 Claims, 3 Drawing Sheets

POWER MOSFET DRIVER AND METHOD THEREFOR

BACKGROUND OF THE INVENTION

The present invention relates, in general, to electronics, and more particularly, to methods of forming semiconductor devices and structure.

In the past, the semiconductor industry utilized various methods and structures to produce power metal oxide semiconductor field effect transistor (power MOSFET) driver circuits there were utilized to drive the power MOSFETs of a power supply system. Typically, one power MOSFET was connected to supply charging voltage to an inductor and a second power MOSFET was connected to discharge the inductor. The second power MOSFET often was referred to as a synchronous rectifier. The power MOSFET typically had a large gate capacitance which had to be driven in order to enable and disable the transistor. The driver circuit had large output transistors in order to supply sufficient drive current to charge and discharge the capacitances of the power MOSFETs. The driver circuit generally received pulse width modulated (PWM) control signals from a PWM controller and drove the appropriate transistors. One example of such a power MOSFET driver circuit was an NCP5355 that was produced by ON Semiconductor of Phoenix Ariz. In some cases, the power supply voltage utilized by the individual drivers of the driver circuit did not provide the most efficient operation.

Accordingly, it is desirable to have a power MOSFET driver that utilizes a power supply voltage that provides efficient operation of the power supply system.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention.

DETAILED DESCRIPTION OF THE DRAWINGS

Figure 1:
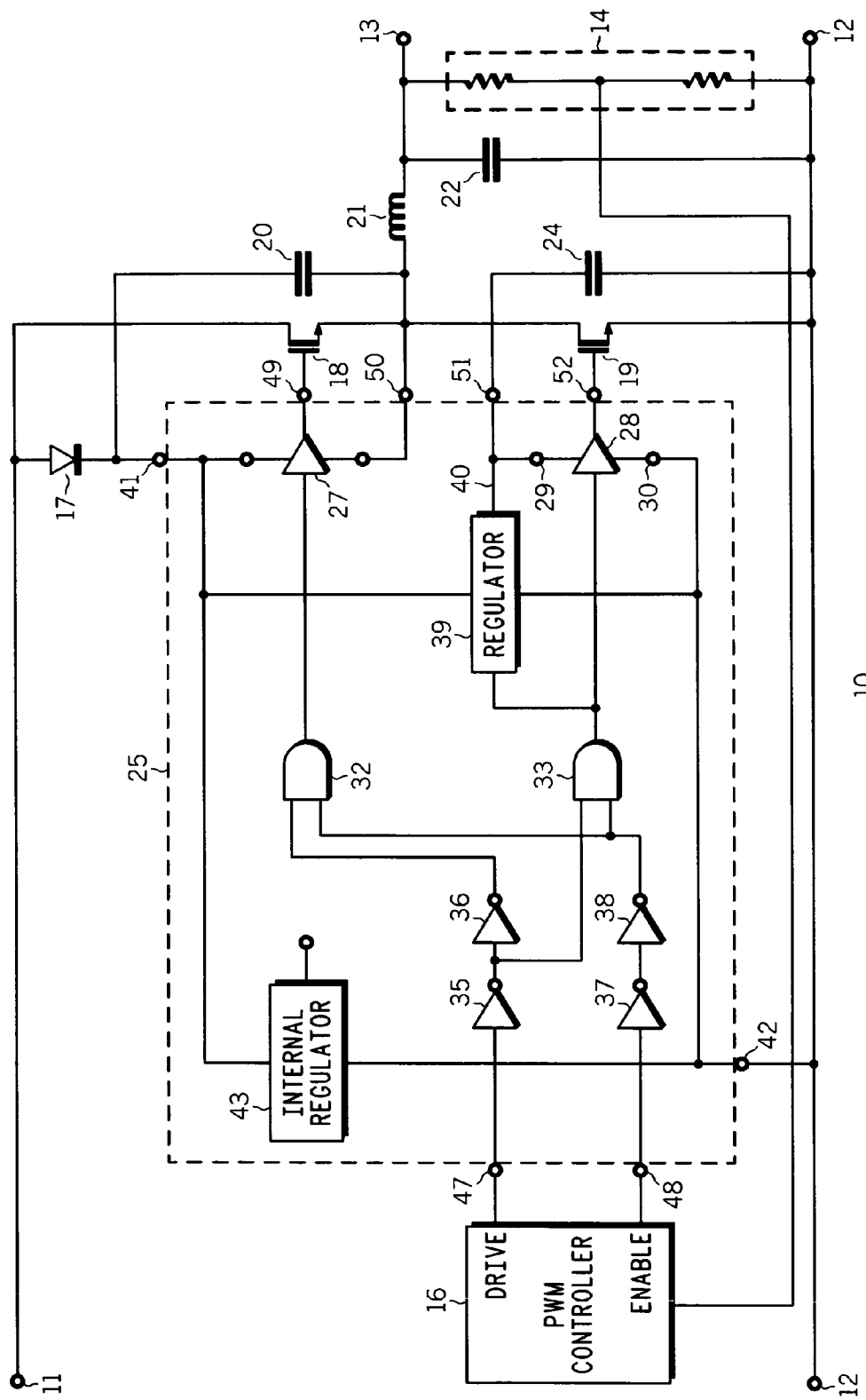
FIG. 1 schematically illustrates an embodiment of a portion of a power supply system in accordance with the present invention.

FIG. 1 schematically illustrates a portion of an embodiment of a power supply system 10 that provides efficient operation. Power supply system 10 receives power from an external source between a power input terminal 11 and a power return terminal 12, and forms a regulated output voltage between an output terminal 13 and terminal 12. Typically, the received power between terminals 11 and 12 is a bulk voltage such as a battery voltage or a rectified sine wave from a household mains. System 10 includes an upper power switch or power MOSFET or transistor 18, a lower power switch or power MOSFET or transistor 19, an energy storage inductor 21, a filter capacitor 22, a boost capacitor 20, a boost diode 17, a low side regulator capacitor 24, a PWM controller 16, and a power MOSFET driver circuit 25. Transistors 18 and 19, inductor 21, capacitor 22, capacitor 20 and capacitor 24 typically are external to circuit 25, however, in some embodiments transistors 18 and 19 or capacitor 20 or capacitor 24 may be formed as a portion of circuit 25. Circuit 25 is formed to receive a PWM drive signal and an enable signal from PWM controller 16 and responsively enable transistor 18 to charge inductor 21 and enable transistor 19 to discharge inductor 21. PWM controller 16 generates the PWM drive signal and the enable signal on respective drive and enable outputs of controller 16. Circuit 25 receives the PWM drive signal on an input 47 and the enable signal on an input 48. Controller typically receives a feedback signal from a feedback network 14 that is representative of the value of the output voltage between terminals 13 and 12. Such PWM controllers are well known to those skilled in the art. One example of such a PWM controller is an NCP5318 that is manufactured by ON Semiconductor of Phoenix Ariz. The bulk voltage applied between terminals 11 and 12 causes diode 17 to conduct and charge capacitor 20 to provide a boost voltage that is utilized as the input voltage to circuit 25. The boost voltage is used as the input voltage for circuit 25 because it provides a voltage that is higher than the regulated output voltage and that is no greater than the input voltage on terminal 11.

Circuit 25 includes a first transistor driver or high side transistor driver 27 that typically is operably coupled to drive transistor 18, a second transistor driver or low side transistor driver 28 that is operably coupled to drive transistor 19, a low side operating voltage regulator or regulator 39, control logic that is utilized to control the signals from PWM controller 16 and form drive control signals that are applied to drivers 27 and 28, and an internal operating voltage regulator or internal regulator 43. The control logic includes an AND gate 32, an AND gate 33, and inverters 35, 36, 37, and 38. Circuit 25 receives the boost voltage as a power supply voltage or input voltage that is applied between a voltage input terminal 41 and a voltage return terminal 42. Internal operating voltage regulator 43 typically is connected between terminal 41 and terminal 42 in order to receive the input voltage and form an internal operating voltage that is used for operating the control logic elements of circuit 25. Low side operating voltage regulator 39 is connected between terminals 41 and 42 in order to receive the input voltage and form a second voltage or low side operating voltage on an output 40 of regulator 39. Output 40 is connected to an output terminal 51 of circuit 25 in order to apply the low side operating voltage to capacitor 24. As will be seen further hereinafter, regulator 39 charges capacitor 24 to the low side operating voltage so that capacitor 24 functions as a filter and storage element for the low side operating voltage. Additionally regulator 39 has a control input that can be used to enable or disable regulator 39 from forming the low side operating on output 40. For example, regulator 39 can have a current source connected to supply a charging current to output 40 when regulator 39 is enabled and to not supply the charging current when regulator 39 is disabled. Driver 28 is connected between output 40 and return terminal 42 in order to use the low side operating voltage on output 40 and capacitor 24 as the operating voltage for driver 28. Driver 27 is connected between terminal 41 and boost return 50 in order to use the input voltage as the operating voltage for driver 28. Typically the input voltage is larger than the internal operating voltage from regulator 43 and larger than the low side operating voltage on output 40. Also the internal operating voltage from regulator 43 generally is larger than the low side operating voltage on output 40.

Figure 2:
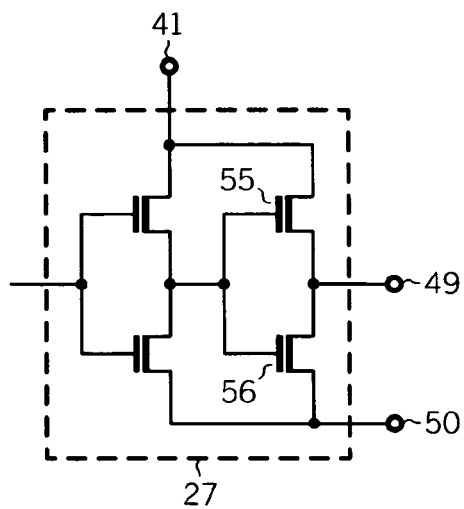
FIG. 2 schematically illustrates an embodiment of a portion of one transistor driver of the power supply system of FIG. 1 in accordance with the present invention.
Figure 3:
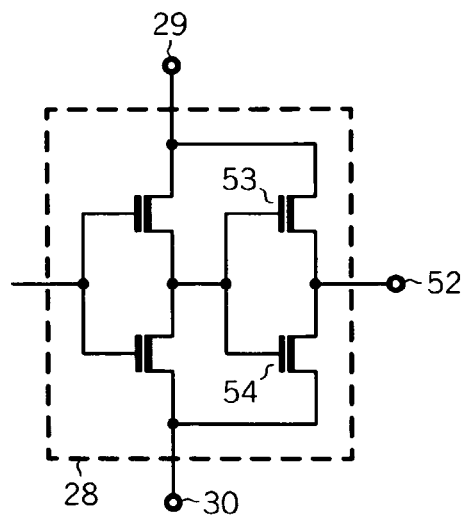
FIG. 3 schematically illustrates an embodiment of a portion of another transistor driver of the power supply system of FIG. 1 in accordance with the present invention.

FIG. 2 and FIG. 3 schematically illustrate an embodiment of a portion of respective transistor drivers 27 and 28. This description has references to FIG. 1, FIG. 2, and FIG. 3. Drivers 27 and 28 generally are buffers that have two inverting stages with each stage having larger transistors that the previous stage in order to achieve the current drive required to drive the gate capacitances of transistors 18 and 19. The output stage of driver 28 typically has an upper transistor 53 and a lower transistor 54. It can be seen, that the value of the voltage on output 52 is approximately equal to the value of the voltage on input 29 minus the voltage drop of transistor 53, thus, the maximum value of the drive signal on output 52 is approximately equal to the value of the voltage on input 29. The minimum value of the drive signal on output 52 is approximately equally to the voltage on terminal 42 plus the voltage drop of transistor 54, thus, the minimum value of the drive signal on output 52 is approximately equal to the value of the voltage on terminal 42. Consequently, the maximum voltage value of the second drive signal corresponds to the low side operating voltage on output 40. Driver 27 similarly has an output stage of having an upper transistor 55 and a lower transistor 56. Driver 27 receives the boost voltage between terminal 41 and return 50 as the operating voltage for driver 27. Thus, the maximum value of the drive signal on output 49 is approximately equal to the value of the voltage on terminal 41 minus the voltage drop across transistor 55 or approximately equal to the value of the voltage on terminal 41. The minimum value of the drive signal on output 49 is approximately equally to the voltage on return 50 plus the voltage drop of transistor 56 or approximately equal to the value of the voltage on return 50. Consequently, the maximum voltage value of the first drive signal corresponds to the input voltage on terminal 41.

In operation, when inputs 47 and 48 are both at a logical high, the output of gate 32 is driven high to provide a drive control signal to the input of driver 27. Driver 27 receives the drive control signal and forces output 49 high. Driver 27 drives output 49 to the maximum value of the drive signal on output 49 or approximately equal to the value of the input voltage and enables transistor 18 to charge inductor 21. Thus, driver 27 is enabled to form an upper voltage value of the first drive signal. The high drive signal on input 47 forces the output of gate 33 low and provides a logic low drive control signal to the input of driver 28. Driver 28 responsively forces the drive signal on drive output 52 to the minimum voltage value or approximately the voltage on terminal 42 and disables transistor 19. Thus, driver 28 is enabled to form a lower voltage value of the second drive signal. The low logic signal from gate 33 is also received by regulator 39 which disables regulator 39 from forming the low side operating voltage on output 40.

If input 47 goes to a logic low while input 48 remains a logic high, the output of gate 32 is driven to a logic low. Driver 27 receives the logic low and forces output 49 low to the minimum voltage value or approximately equal to the voltage on return 50 and disables transistor 18. Thus, driver 27 is enabled to form a lower voltage value of the first drive signal. The low on input 47 also drives the output of gate 33 to a logic high. The high control signal from gate 33 enables regulator 39 to form the low side operating voltage on output 40 and charge capacitor 24 to that value. Driver 28 receives the logic high signal and forces output 52 high to the maximum voltage value or approximately equal to the value of the low side operating voltage and enables transistor 19. Thus, driver 28 is enabled to form an upper voltage value of the second drive signal.

The value of the voltage on output 40 of regulator 39 is selected to provide the drive voltage to transistor 19 that provides a low on-resistance for transistor 19. As is well known to those skilled in the art, the on-resistance of a power MOSFET is a function of the voltage that is applied to the gate of the power MOSFET. If the voltage is low the on-resistance typically is high. As the voltage increases, the on-resistance decreases. At some gate voltage value the on-resistance becomes asymptotical to a minimum on resistance value. A voltage value that is no less than the value of a knee of the on-resistance curve typically is used for the value of the voltage on output 40. This value is lower than the value of the voltage used for the operating voltage of driver 27. Using a lower voltage for the operating voltage of driver 28 than the operating voltage of driver 27 reduces the power consumption of circuit 25. Using a voltage that reduces the on-resistance of transistor 19 reduces the power consumption of system 10. Enabling regulator 39 to form the low side operating voltage responsively to forming a control signal to enable transistor 19 also reduces the power consumption of circuit 25 since regulator 39 is not consuming power during the entire operating cycle of circuit 25. It should be noted that regulator 39 may be enabled for shorter or longer periods of time. For example, regulator 39 may be enabled for only a portion of the time that the output of gate 33 is a logic high.

In order to provide the described functionality, a cathode of diode 17 is connected to terminal 11 and to a drain of transistor 18. An anode of diode 17 is connected to terminal 41 and to a first terminal of capacitor 20. A second terminal of capacitor 20 is commonly connected to return 50, a source of transistor 18, a first terminal of inductor 21, and a drain of transistor 19. A second terminal of inductor 21 is commonly connected to output terminal 13 and a first terminal of capacitor 22. Terminal 41 is connected to a power input of regulator 43, a power input of regulator 39, and a power input of driver 27. An output of driver 27 is connected to output 49 which is connected to a gate of transistor 18. A power return of driver 27 is connected to return 50. An input of driver 27 is connected to an output of gate 32. A first input of gate 32 is connected to an output of inverter 36 which has an input connected to an output of inverter 35 and to a first input of gate 33. A second input of gate 32 is connected to a second input of gate 33 and to an output of inverter 38. An input of inverter 38 is connected to an output of inverter 37 which has an input connected to input 48. An input of inverter 35 is connected input 47. An output of gate 33 is connected to a control input of regulator 39 and to an input of driver 28. Power input 29 of driver 28 is commonly connected to output 40 of regulator 39, output terminal 51, and a first terminal of capacitor 24. Power return 30 of driver 28 is commonly connected to a power return of regulator 39, a power return of regulator 43, and to power terminal 42. Terminal 12 is commonly connected to terminal 42, a second terminal of capacitor 24, a source of transistor 19, and a second terminal of capacitor 22.

Figure 4:
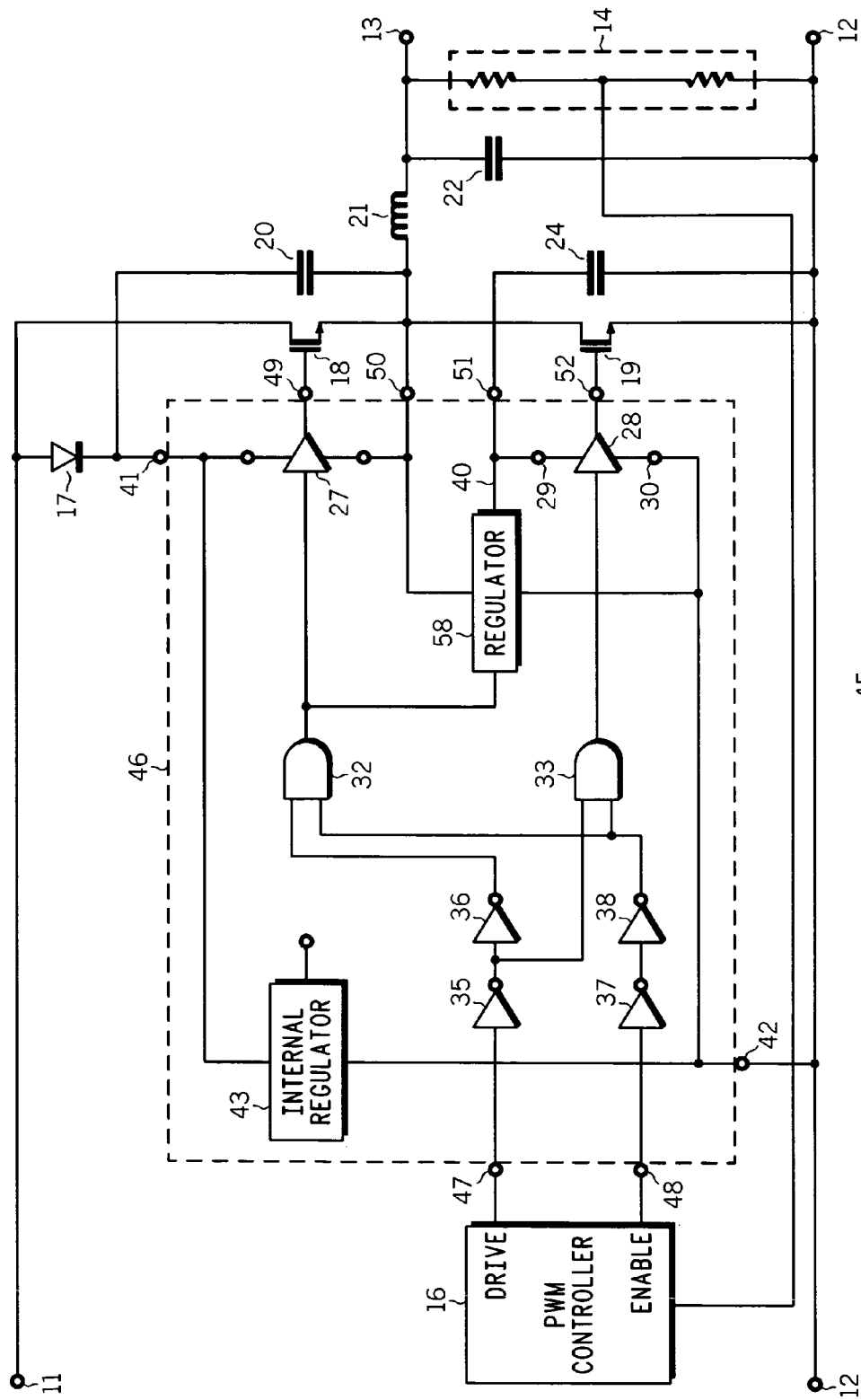
FIG. 4 schematically illustrates an embodiment of a portion of a power supply system that is an alternate to the power supply system of FIG. 1 in accordance with the present invention

FIG. 4 schematically illustrates a portion of an embodiment of a power supply system 45 that includes a power MOSFET driver circuit 46. System 45 is an alternate embodiment of system 10 and circuit 46 is an alternate embodiment of circuit 25 that were explained in the description of FIG. 1 and FIG. 2. Circuit 46 includes a regulator 58 that is the same as regulator 39 except that regulator 58 is connected to receive power from boost return 50. Regulator 58 is configured to form the low side operating voltage responsively to forming a control signal to enable transistor 18 instead of the control signal that enables transistor 19. When transistor 18 is enabled, the voltage on return 50 is approximately equal to the boost voltage. Regulator 58 is enabled and charges capacitor 24 to the low side operating voltage. After the control signal on the output of gate 32 is negated, regulator 58 is also negated. However capacitor 24 is charged to the low side operating voltage and supplies power to driver 28 to enable transistor 19 as described hereinbefore. Charging capacitor 24 from regulator 58 during a portion of the time that transistor 18 is enabled also reduces the power consumption of circuit 46 since regulator 58 is not consuming power during the entire operating cycle of circuit 46.

Figure 5:
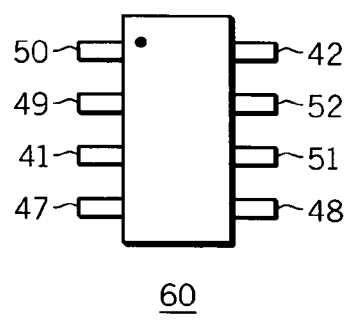
FIG. 5 illustrates an enlarged plan view of an embodiment of a semiconductor package having a semiconductor die on which a driver circuit of the power supply system of FIG. 1 is formed in accordance with the present invention.

FIG. 5 schematically illustrates a graphical representation of an embodiment of an eight terminal semiconductor package 60 in which circuit 25 may be packaged. The pins or terminals of package 60 correspond to the terminals of circuit 25 illustrated in FIGS. 1 and 2.

Figure 6:
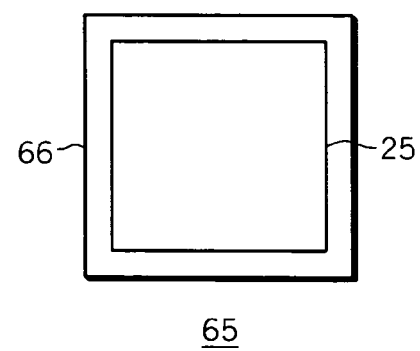
FIG. 6 illustrates an enlarged plan view of an embodiment of a semiconductor device having a driver circuit formed on a semiconductor die in accordance with the present invention.

FIG. 6 schematically illustrates an enlarged plan view of a portion of an embodiment of a semiconductor device 65 that is formed on a semiconductor die 66. Circuit 25 is formed on die 66. Die 66 may also include other circuits that are not shown in FIG. 6 for simplicity of the drawing. Circuit 25 and device 65 are formed on die 66 by semiconductor manufacturing techniques that are well known to those skilled in the art.

In view of all of the above, it is evident that a novel device and method is disclosed. Included, among other features, is forming a low side driver of a power MOSFET driver to operate from a lower operating voltage than a high side driver. Using the lower operating voltage improves the efficiency of the driver and the system using the driver. Using a low side operating voltage having a value that is no less than a voltage of a knee of the on-resistance curve of the power transistor also improves the efficiency of the power supply system that uses the controller. Enabling the low side regulator to form the low side operating voltage for a portion of the time that the low side driver is enabled also reduces power consumption and improves efficiency.

While the invention is described with specific preferred embodiments, it is evident that many alternatives and variations will be apparent to those skilled in the semiconductor arts. More specifically the invention has been described for a particular PNP and NPN transistor structure, although the method is directly applicable to other bipolar transistors, as well as to MOS, BiCMOS, metal semiconductor FETs (MESFETs), HFETs, and other transistor structures. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A power MOSFET driver comprising:
   a semiconductor package having no more than eight external connection terminals and containing a semiconductor die on which the power MOSFET driver is formed;
   a first input of the no more than eight external connection terminals configured to receive a supply voltage having a first value for powering the power MOSFET driver, wherein the power MOSFET driver externally receives the supply voltage;
   a first transistor driver coupled to operate from the supply voltage and form a first drive signal operable to drive a first MOS transistor;
   a circuit configured to form a first power supply voltage having a second value that is less than the first value of the supply voltage and is derived internally within the power MOSFET driver from the supply voltage;
   control logic configured to operate from the first power supply voltage; and
   a second transistor driver coupled to operate from a second power supply voltage having a third value that is less than the second value and form a second drive signal operable to drive a second MOS transistor.

2. The power MOSFET driver of claim 1 wherein the second transistor driver coupled to operate from the second power supply voltage having the third value includes a first voltage regulator coupled to receive the supply voltage and form the second power supply voltage.

3. The power MOSFET driver of claim 2 wherein the first voltage regulator is configured to form the second power supply voltage responsively to enabling the second transistor driver to form a high value of the second drive signal.

4. The power MOSFET driver of claim 1 wherein the first transistor driver is configured to form a high value of the first drive signal from the supply voltage.

5. The power MOSFET driver of claim 1 wherein the second transistor driver is configured to form a high value of the second drive signal from the second power supply voltage.

6. The power MOSFET driver of claim 1 wherein the semiconductor package includes a first external terminal of the no more than eight external connection terminals coupled to receive the first drive signal from the first transistor driver, and a second external terminal of the no more than eight external connection terminals coupled to receive the second drive signal from the second transistor driver.

7. The power MOSFET driver of claim 1 further including a first voltage regulator coupled to receive the supply voltage and form the second power supply voltage wherein an output of the first voltage regulator is coupled to a third external terminal of the no more than eight external connection terminals of the semiconductor package.

8. A method of forming a power MOSFET driver comprising:
   configuring a first input to receive a supply voltage having a first voltage value for powering the power MOSFET driver, wherein the power MOSFET driver externally receives the supply voltage;
   configuring a first transistor driver of the power MOSFET driver to operate tram the supply voltage and form a first drive signal having an output voltage value corresponding to the first voltage value;

configuring the power MOSFET driver to form a first power supply voltage having a second voltage value that is less than the first voltage value and is derived internally within the power MOSFET driver from the supply voltage; and configuring a second transistor driver of the power MOSFET driver to form a second drive signal having an output voltage value corresponding to a third voltage value that is less than the second voltage value.

9. The method of claim 8 wherein configuring the second transistor driver of the power MOSFET driver to form the second drive signal having the output voltage value corresponding to the third voltage value includes configuring a power supply to form the third voltage value responsively to an external control signal.

10. The method of claim 9 wherein configuring the power supply to form the third voltage value responsively to the external control signal includes configuring the power MOSFET driver to disable an internal power supply from generating the third voltage value responsively to enabling the second transistor driver to form a lower voltage value of the second drive signal.

11. The method of claim 9 wherein configuring the power supply to form the third voltage value includes configuring an internal power supply to supply current to charge a capacitor responsively to enabling the second transistor driver to form the upper voltage value of the second drive signal.

12. The method of claim 8 wherein configuring the first transistor driver of the power MOSFET driver includes configuring the first transistor driver to form a maximum value of the first drive signal corresponding to the first voltage value.

13. The method of claim 8 wherein configuring the second transistor driver of the power MOSFET driver to form the second drive signal having the output voltage value corresponding to the third voltage value includes configuring the second transistor driver to form a maximum value of the second drive signal corresponding to the third voltage value.

14. The method of claim 8 wherein configuring the second transistor driver of the power MOSFET driver to form the second drive signal having the output voltage value corresponding to the third voltage value includes configuring the power MOSFET driver to form the third voltage value from the first voltage value.

15. The method of claim 8 further including forming the power MOSFET driver on one semiconductor die and positioned within a semiconductor package having no greater than eight package terminals wherein the first input is one of the no greater than eight package terminals, coupling an output of the first transistor driver to a first output terminal of the semiconductor package, coupling an output of the second transistor driver to a second output terminal of the semiconductor package, and coupling a voltage return of the second transistor driver to a voltage return terminal of the semiconductor package.

16. The method of claim 8 further including coupling control logic to operate from the first power supply voltage and control operation of a portion of the power MOSFET driver.

17. A method of operating a power MOSFET driver comprising:

operating a first transistor driver of the power MOSFET driver from a first operating voltage value, wherein the power MOSFET driver externally receives the supply voltage value;

operating control logic of the power MOSFET driver from a second operating voltage value that is derived from the first operating voltage value internally within to the power MOSFET driver wherein the second operating voltage value is less than the first operating voltage value; and operating a second transistor driver of the power MOSFET driver from a third operating voltage value that is less than the second operating voltage value.

18. The power MOSFET driver of claim 1 further including a drive input of the no more than eight external connection terminals wherein the drive input is configured to receive a drive control signal that sets operating states of the first and second drive control signals, and an enable input of the no more than eight external connection terminals wherein the enable input is configured to receive an enable control signal and wherein a disabled state of the enable control signal sets a negated state of both the first and second drive control signals.

19. The power MOSFET driver of claim 9 wherein configuring the power supply to form the third voltage value responsively to the external control signal includes configuring the power supply to be enabled to form the third voltage responsively to a first state of the external control signal and to be disabled from generating the third voltage responsively to a second state of the external control signal.

* * * * *

UNITED STATES PATENT AND TRADEMARK OFFICE
CERTIFICATE OF CORRECTION

PATENT NO. : 7,126,388 B2 Page 1 of 1
APPLICATION NO. : 11/013074
DATED : October 24, 2006
INVENTOR(S) : Paul J. Harriman It is certified that error appears in the above-identified patent and that said Letters Patent is hereby corrected as shown below:

In Claim 8, column 6, line 67, change "tram" to -- from --;
In Claim 19, column 8, line 41, change "power MOSFET driver" to -- method --.

Signed and Sealed this

Second Day of December, 2008

JON W. DUDAS
*Director of the United States Patent and Trademark Office*